United States Patent
Lai et al.

(10) Patent No.: US 6,364,958 B1
(45) Date of Patent: Apr. 2, 2002

(54) PLASMA ASSISTED SEMICONDUCTOR SUBSTRATE PROCESSING CHAMBER HAVING A PLURALITY OF GROUND PATH BRIDGES

(75) Inventors: Canfeng Lai, Fremont; Michael Santiago Cox, Davenport; Michael Barnes, San Ramon; Lily L. Pang, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/577,104

(22) Filed: May 24, 2000

(51) Int. Cl.[7] ............................ C23C 16/00; H05H 1/00
(52) U.S. Cl. ................. 118/728; 118/723 E; 118/723 I; 156/345; 204/298.34
(58) Field of Search .............................. 118/728, 723 E, 118/723 I, 715, 500, 504; 156/345; 204/298.34

(56) References Cited

U.S. PATENT DOCUMENTS

| | | | |
|---|---|---|---|
| 5,556,501 A | * | 9/1996 | Collins et al. ............... 156/345 |
| 6,013,584 A | | 1/2000 | M'Saad ....................... 438/783 |
| 6,074,488 A | * | 6/2000 | Roderick et al. ............ 118/728 |
| 6,174,370 B1 | * | 1/2001 | Yoshida ....................... 118/500 |
| 6,176,969 B1 | * | 1/2001 | Park et al. ................... 156/345 |
| 6,178,919 B1 | * | 1/2001 | Li et al. ................... 118/723 E |

* cited by examiner

Primary Examiner—Gregory Mills
Assistant Examiner—P. Hassanzadeh
(74) Attorney, Agent, or Firm—Moser, Patterson & Sheridan

(57) ABSTRACT

A plasma assisted semiconductor substrate processing chamber having a plurality of electrically conductive bridges for preventing electrical arcing in the chamber. More particularly, the chamber has a plurality of electrically conductive bridges that connect a portion of a substrate support member with a portion of the chamber walls.

18 Claims, 2 Drawing Sheets

PLASMA ASSISTED SEMICONDUCTOR SUBSTRATE PROCESSING CHAMBER HAVING A PLURALITY OF GROUND PATH BRIDGES

BACKGROUND OF THE DISCLOSURE

1. Field of the Invention

The present invention relates to a plasma assisted semiconductor substrate processing chamber. More particularly, the invention relates to a plasma assisted semiconductor substrate processing chamber having a plurality of electrically conductive bridges that connect a portion of a substrate support member with a portion of the chamber walls.

2. Description of the Background Art

In plasma assisted semiconductor substrate processing chambers, an electrical discharge, or electrical arcing phenomenon can occur, particularly when a high frequency radio frequency (RF) power source is employed to power a substrate electrode in a substrate support member and when the chamber is large (c.g., capable of processing 300 mm substrates). The electrical arc can cause sputtering of chamber wall material that deposits on and contaminates a substrate that is presently in the chamber or a substrate that is later introduced into the chamber.

For example, arcing has been observed in a plasma assisted chemical vapor deposition (CVD) chamber that is designed to process 300 mm substrates. The chamber has electrically conductive walls that are DC grounded. One RF power source is utilized for plasma generation while another RF power source powers a substrate electrode in a substrate support member to provide substrate biasing during processing. A single electrically conductive bridge connects a grounded portion of the substrate support member with a portion of the grounded chamber walls, providing an RF ground path from the substrate support member to the chamber walls. Within such a chamber, arcing from the plasma to the chamber sidewalls has been observed when the RF power source coupled to the substrate electrode is activated.

Arcing from the plasma to the chamber walls has been determined to be the result of chamber geometry being such that the largest electrical RF return path length exceeds approximately ¼ wavelength of a surface RF wave inside the chamber. According to RF theory, high density, magnetic field-free plasma sources, as may be used in certain CVD chambers, produce plasmas that are opaque to RF fields within a frequency range from 0–200 MHz. For this reason, RF currents flow along the surface of the plasma. In effect, the surface of the plasma forms one electrode and the chamber wall forms another electrode of a waveguide. The width of the waveguide is the width of the plasma sheath and the length of the waveguide is the inner circumference of the chamber. When the largest electrical RF return path length exceeds approximately ¼ of a surface RF wavelength inside the chamber, a standing wave will form "RF nodes". The RF nodes arise at random locations along the surface of the chamber walls. Extremely high voltage can be created between the RF nodes and a plasma within the chamber, causing an electrical discharge between the plasma and the chamber walls, which is known as electrical arcing or unpopular arcing.

According to surface wave theory, in the presence of a plasma, an RF wave propagated along conductive chamber surfaces takes the form of a surface wave, with its wavelength and phase velocity reduced by a factor of approximately five as compared with free space [Eqs (1,2)]. As stated above, electrical arcing will occur when the largest electrical RF return path exceeds approximately ¼ of a surface RF wavelength inside the chamber. Since the surface RF wavelength in a chamber is approximately ⅕ of the free space wavelength, electrical arcing occurs when the inner circumference of the chamber exceeds approximately (¼)·(⅕) or 1/20 of a free space RF wavelength.

The following surface wave theory equation shows that, as discussed above, the RF wavelength and phase velocity along chamber surfaces (i.e., in the waveguide formed between the plasma and the chamber walls) are reduced by a factor of approximately five compared to free space, in the limit of $\omega_{pe}/\omega \gg 1$, and $\delta > d$, $$V_{phase} = c/(\delta/d+1)^{1/2} \tag{1}$$

where:

$V_{phase}$ is the RF phase velocity along a conducting surface;

c is the speed of light;

$\delta = c/\omega_{pe}$ is the RF skin depth, where $\omega_{pe}$ is the plasma frequency;

$d \equiv V_{te}/\omega_{pe} f(V_{rf}, T_c)$ is the plasma sheath thickness, $V_{te}$ is the electron thermal velocity, and $f(T_c, V_{rf})$ depends on the sheath model and is a function of the electron temperature $T_c$ and the RF voltage $V_{rf}$.

For Te=5 eV and $f(V_{rf}, T_c) = 10$ (d is 10 times the Debye length), $$V_{phase} = c/(\delta/d+1)^{1/2} \cong c/5 \tag{2}$$

The Equation (1) and (2) can also be written as:

$$\lambda_{surface} = \lambda_0/(\delta/d+1)^{1/2} \cong \lambda_0/5 \tag{3}$$

where $\lambda_{surface}$ is the RF wavelength along the chamber walls, and $\lambda_0$ is the free space wavelength of the RF signal.

Therefore, where the largest electrical RF return path exceeds approximately ¼ of the surface RF wavelength, or 1/20 of a free space RF wavelength inside the chamber, electrical arcing can occur and can cause sputtering of chamber wall material. In chambers with a single conductive bridge leading from a portion of a substrate support member to DC grounded, conductive chamber walls, the largest electrical RF return path is at least about equal to the inner circumference of the chamber wall. Therefore, in such a single bridge chamber, electrical arcing can occur where the inner chamber wall circumference exceeds approximately ¼ of a surface RF wavelength. Furthermore, in a single bridge chamber, electrical arcing can occur if the inner chamber wall circumference exceeds approximately 1/20 of a free space RF wavelength.

Electrical arcing has particularly become a problem as larger plasma assisted chambers are being designed and used to accommodate 300 mm diameter substrates. Chambers that accommodate large substrates generally have commensurately larger inner chamber wall circumferences. Therefore, for a given RF power frequency utilized, when the chamber is designed large enough so that the chamber wall inner circumference exceeds approximately ¼ of a surface RF wavelength or approximately 1/20 of a free space RF wavelength for the highest frequency RF power employed to power a substrate electrode in a substrate support member, electrical arcing can occur in the chamber.

In addition, in some instances a second or greater harmonic frequency of a surface wave inside the chamber has sufficient energy to lead to RF nodes and cause electrical arcing. Since each numerically greater harmonic has a wavelength half as great as the previous harmonic, the chamber wall inner circumference that might give rise to electrical arcing for each succeeding harmonic is half that of the previous harmonic.

Therefore, a need exists in the art for a plasma assisted semiconductor substrate processing chamber in which electrical arcing caused by surface wave effects is eliminated.

SUMMARY OF THE INVENTION

The present invention provides a plasma assisted semiconductor substrate processing chamber having a plurality of electrically conductive bridges connecting a portion of a substrate support member with a portion of the chamber walls. The plurality of bridges can prevent electrical arcing from occurring, in the chamber, particularly when a high frequency, radio frequency (RF) power source is employed to power a substrate electrode in a substrate support member within a large chamber. In one aspect, the invention provides a plasma assisted chamber having a plurality of electrically conductive bridges connecting a portion of a substrate support member with a portion of the DC grounded chamber walls.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention generally provides a plasma assisted semiconductor substrate processing chamber having a plurality of electrically conductive bridges. In one embodiment, the invention provides a chamber having a plurality of electrically conductive bridges connecting a portion of a substrate support member with the DC grounded chamber walls for preventing electrical arcing in the chamber.

After considering the following description, those skilled in the art will clearly realize that the teachings of the invention can be readily utilized to prevent electrical arcing in plasma assisted semiconductor substrate processing chambers, particularly when a high frequency RF power source is employed to power a substrate electrode in a substrate support member within a relatively large chamber.

Figure 1:
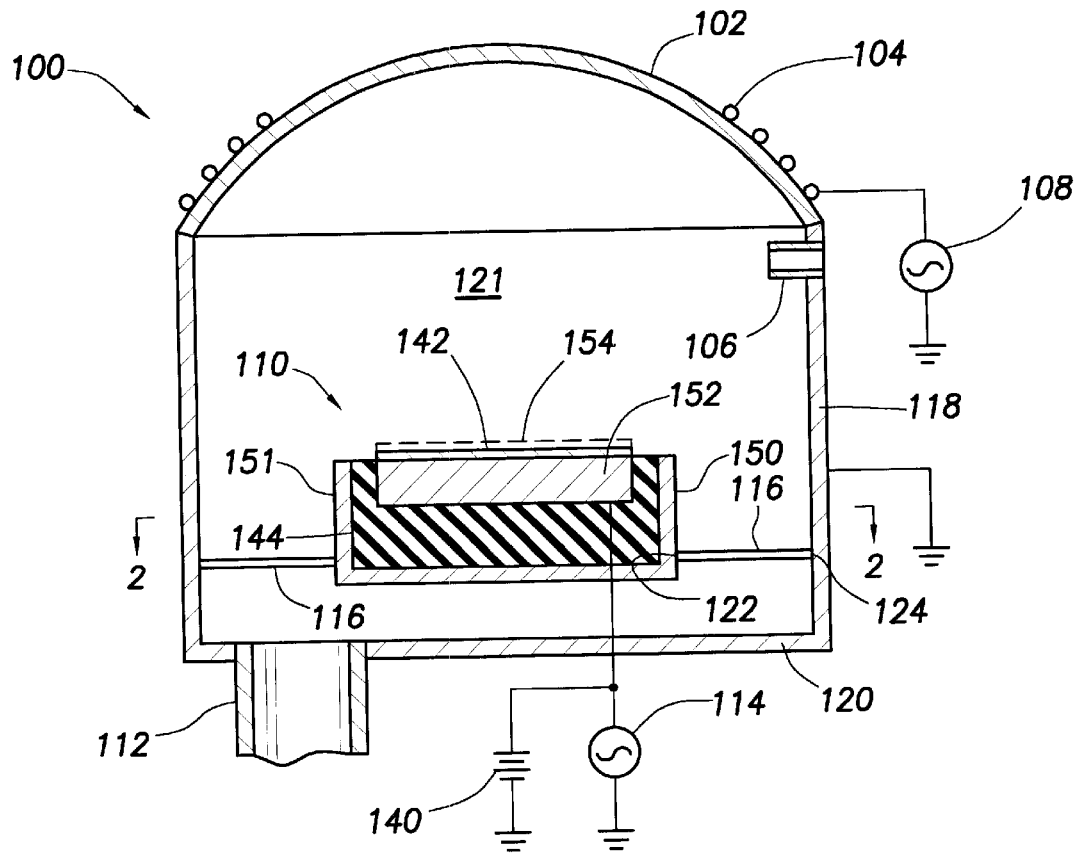
FIG. 1 shows a cross sectional side view of a chamber having a plurality of bridges.

FIG. 1 shows a cross sectional side view of a plasma assisted chemical vapor deposition (CVD) chamber 100 having a plurality of bridges 116 (one is shown). Plasma assisted CVD chambers are well known in the art. The chamber 100 generally includes a processing region 121 enclosed by a bottom 120, a sidewall 118, and a dome 102. A gas inlet 106 is formed in the sidewall 118, and a gas outlet 112 is formed in the bottom 120. A coiled antenna 104 is mounted on the dome 102 and coupled to a first RF power source 108. The coiled antenna 104, when driven by RF power source 108, couples energy to a gas or gases in the chamber 100 to form a plasma in the chamber 100. The sidewall 118 and bottom 120 are DC and RF grounded.

A substrate support member 110 is disposed in the processing region 121. The substrate support member 110 may comprise a grounded electrically conductive bucket 150 and an electrostatic chuck 151 disposed within the bucket 150. The electrostatic chuck 151 may comprise an insulating material 144 and an electrically conductive substrate electrode 152 disposed in a recess formed in the insulating material 144. A thin layer of dielectric material 142 is disposed on top of the substrate electrode 152. A second RF power source 114 and a chucking power source 140 are coupled to the substrate electrode 152. The second RF power source 114 provides substrate biasing during substrate processing, and the chucking power source 140 provides DC power and is used to secure or chuck a substrate 154 to the dielectric material 142 during substrate processing. A plurality (preferably three) bridges 116 that are electrically conductive are connected at a first end 122 to the bucket 150 and at a second end 124 end to a portion of the chamber sidewall 118.

Figure 2:
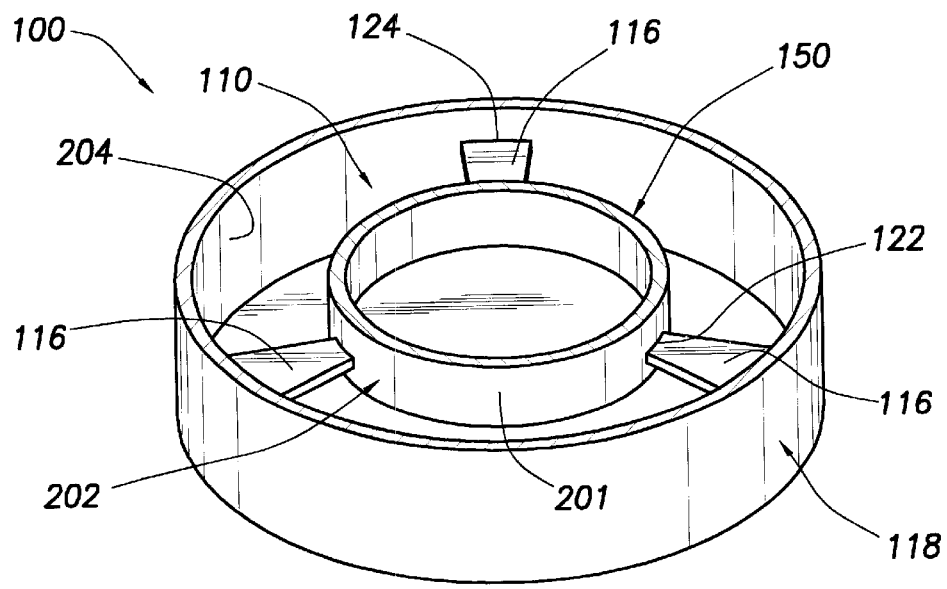
FIG. 2 shows a cross sectional perspective view of the chamber taken along line 2—2 of FIG. 1.

FIG. 2 shows a cross sectional perspective view of the plasma assisted chamber 100 taken along line 2—2 of FIG. 1. The three bridges 116 are equally spaced from one another. Each bridge 116 is connected at its first end 122 to a portion of the outer surface 201 of the sidewall 202 of the bucket 150 and at its second end 124 to a portion of the inner surface 204 of the DC and RF grounded chamber sidewall 118. Each of the bridges 116 thereby forms an electrical ground path between the bucket 150 of the substrate support member 110 and the grounded chamber sidewall 118. The bridges 116 are conductive, and may be fabricated of materials such as aluminum. The bridges 116 have physical dimensions that form a surface area that is sufficient to carry the expected RF currents from the substrate support member 110 to the chamber walls. In the embodiment shown, the bridges 116 are 4 inches wide and 2 inches thick. Various embodiments of the bridges are possible, including solid, as shown, or mesh (as described below with reference to FIG. 3).

In operation, the bridges 116 prevent electrical arcing that could otherwise occur when the second RF power source 114 is activated. An electrical arc is an electrical discharge that can occur between plasma in the chamber 100 and a point along the inner surface 204 of the chamber sidewall 118 where an RF node has formed. Since chamber 100 has three bridges 116, the largest electrical RF return path is approximately ⅓ of a circumference of the inner surface 204 of the chamber sidewall 118, i.e., the bridges 116 provide ground points along the waveguide formed by the plasma and chamber walls. Thus, for a given second RF power source 114 frequency, the plurality of bridges 116 reduces the largest electrical RF return path to substantially less than ¼ of a surface RF wavelength, or substantially less than 1/20 of a free space RF wavelength, and thereby increases the inner chamber wall circumference that can be utilized without causing electrical arcing in the chamber. Consequently, by utilizing a plurality of bridges instead of only one bridge, chamber size can be increased and electrical arcing avoided. Further increases in chamber size can be accommodated by adding more bridges. If arcing due to energy in harmonic frequencies is expected, additional bridges may be used to reduce the distance between bridges to substantially less than ¼ of the surface wavelength of the harmonic frequency. As such, if the second harmonic is expected to cause arcing, six bridges may be used in the chamber to mitigate arcing.

Figure 3:
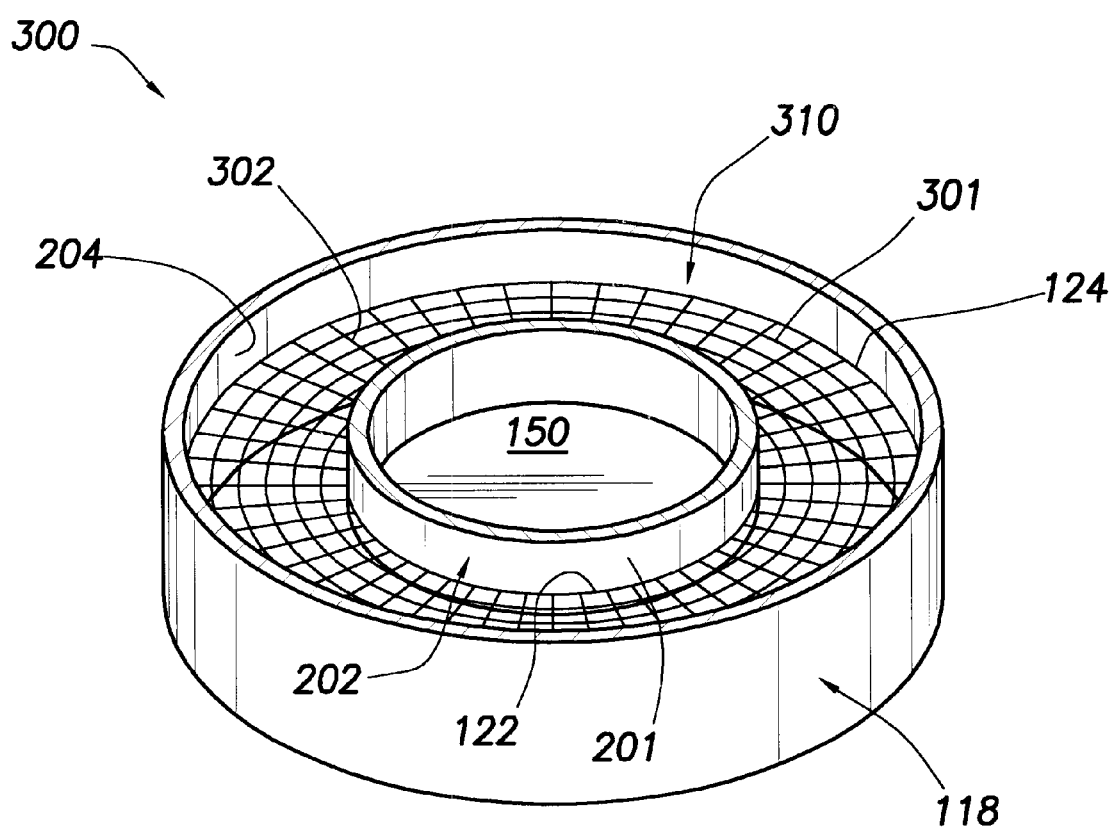
FIG. 3 shows a cross sectional perspective view of a chamber containing a second embodiment of the invention.

FIG. 3 shows a cross sectional perspective view of a second embodiment of the chamber 300. This chamber 300 is similar to the chamber 100 of FIGS. 1 and 2, except that the chamber 300 has a metallic wire mesh 310 disposed between the bucket 150 and the chamber sidewall 118. In one embodiment, the mesh 310 comprises a plurality of radially extending wire bridges 302 with a plurality of concentric wire rings 301 connecting the bridges 302. Bridges formed of a metallic mesh function in the same manner as described above. Bridges formed of a metallic mesh provide ground paths from the bucket 150 to the grounded chamber sidewall 118 to eliminate the formation of a standing wave. Additionally, since the mesh 310 is not solid, gases flow through spaces in the mesh 310.

Although various embodiments which incorporate the teachings to the present invention have been shown and described in detail herein, those skilled in the art can readily devise many other varied embodiments that still incorporate these teachings.

We claim:

1. A plasma assisted semiconductor substrate processing chamber, comprising:

an enclosure comprising conductive walls;

a substrate support disposed within the enclosure; and a plurality of electrically conductive members connecting a portion of the substrate support with a portion of the walls, wherein the electrically conductive members are disposed such that a largest electrical RF return path length within the enclosure is less than approximately $\frac{1}{4}$ of a surface RF wavelength formed in the enclosure.

2. The plasma assisted semiconductor substrate processing chamber of claim 1, wherein the walls comprise a sidewall having an inner surface, and wherein the substrate support comprises a sidewall having an outer surface, and wherein the electrically conductive members connect a portion of the inner surface of the sidewall of the walls with a portion of the outer surface of the sidewall of the substrate support.

3. The plasma assisted semiconductor substrate processing chamber of claim 2, wherein the substrate support member comprises an electrostatic chuck.

4. The plasma assisted semiconductor substrate processing chamber of claim 1, wherein an RF power source and a DC power source are coupled to a substrate electrode in the substrate support, and wherein the walls are grounded.

5. The plasma assisted semiconductor substrate processing chamber of claim 4, wherein an insulating material is disposed between the sidewall of the substrate support and the substrate electrode.

6. The plasma assisted semiconductor substrate processing chamber of claim 1, wherein the electrically conductive members are equally spaced from each other.

7. The plasma assisted semiconductor substrate processing chamber of claim 1, wherein the electrically conductive members are disposed such that electrical arcing is prevented within the enclosure.

8. The plasma assisted semiconductor substrate processing chamber of claim 1, wherein the electrically conductive members are disposed such that the formation of one or more standing waves within the chamber is prevented.

9. The plasma assisted semiconductor substrate processing chamber of claim 1, wherein the electrically conductive members are disposed such that the formation of one or more RF nodes within the chamber is prevented.

10. The plasma assisted semiconductor substrate processing chamber of claim 1, wherein the electrically conductive members are disposed such that the largest electrical RF return path length within the enclosure is less than approximately $\frac{1}{20}$ of a smallest free space RF wavelength corresponding to a driving frequency and harmonics of the driving frequency formed in the enclosure.

11. The plasma assisted semiconductor substrate processing chamber of claim 1, wherein the electrically conductive members are made of metal.

12. The plasma assisted semiconductor substrate processing chamber of claim 11, wherein the electrically conductive members are made of metal mesh.

13. The plasma assisted semiconductor substrate processing chamber of claim 1, wherein the plasma assisted semiconductor substrate processing chamber is a chemical vapor deposition chamber.

14. The plasma assisted semiconductor substrate processing chamber of claim 1, wherein the plasma assisted semiconductor substrate processing chamber is an etch chamber.

15. The plasma assisted semiconductor substrate processing chamber of claim 1, further comprising a coiled antenna adapted to process a 300 mm semiconductor substrate.

16. A plasma assisted semiconductor substrate processing chamber, comprising:

an enclosure comprising a grounded sidewall having an inner surface;

a substrate support member disposed within the enclosure having a sidewall having an outer surface;

an RF power source and a DC power source coupled to the substrate support member; and a plurality of electrically conductive members connecting a portion of the inner surface of the sidewall of the enclosure with a portion of the outer surface of the sidewall of the substrate support member, wherein the electrically conductive members provide RF ground paths from the sidewall of the substrate support member to the sidewall of the enclosure, and wherein the electrically conductive members are disposed such that electrical arcing is prevented within the enclosure, wherein the electrically conductive members are disposed such that a largest electrical RF return path length within the enclosure is less than approximately $\frac{1}{4}$ of a surface RF wavelength formed in the enclosure.

17. The plasma assisted semiconductor substrate processing chamber of claim 16, wherein the electrically conductive members are disposed such that the largest electrical RF return path length within the enclosure is less than approximately $\frac{1}{20}$ of a smallest free space RF wavelength formed in the enclosure.

18. The plasma assisted semiconductor substrate processing chamber of claim 16, further comprising a coiled antenna adapted to process a 300 mm semiconductor substrate.

* * * * *

UNITED STATES PATENT AND TRADEMARK OFFICE
CERTIFICATE OF CORRECTION

PATENT NO. : 6,364,958 B1
DATED : April 2, 2002
INVENTOR(S) : Lai et al.

It is certified that error appears in the above-identified patent and that said Letters Patent is hereby corrected as shown below:

Column 1,
Line 62, please replace "unpopular" with -- unipolar --.

Column 3,
Line 15, please delete "," after -- occurring --.

Column 5,
Line 14, please replace "to" with -- of --.

Signed and Sealed this

Second Day of July, 2002

Attest:

JAMES E. ROGAN
Attesting Officer
Director of the United States Patent and Trademark Office